United States Patent [19]

Sanders et al.

[11] Patent Number: 5,554,937
[45] Date of Patent: Sep. 10, 1996

[54] APPARATUS AND METHOD FOR SENSING MATERIAL LEVEL BY CAPACITANCE MEASUREMENT

[75] Inventors: Gary G. Sanders; Brian J. Goodwin, both of Rock Falls, Ill.

[73] Assignee: Penberthy, Inc., Prophetstown, Ill.

[21] Appl. No.: 441,140

[22] Filed: May 15, 1995

Related U.S. Application Data

[62] Division of Ser. No. 123,316, Sep. 17, 1993, Pat. No. 5,461,321.

[51] Int. Cl.$^6$ ............................. G01R 27/26; G01F 23/26
[52] U.S. Cl. ......................... 324/664; 324/671; 324/678; 320/1; 73/304 C
[58] Field of Search ......................... 324/663, 664, 324/671, 676, 678, 71.1; 320/1; 73/304 R, 304 C

[56] References Cited

U.S. PATENT DOCUMENTS

| | | | |
|---|---|---|---|
| 3,778,708 | 12/1973 | Anders et al. | 324/62 |
| 3,993,947 | 11/1976 | Maltby et al. | 324/60 R |
| 4,146,834 | 3/1979 | Maltby et al. | 324/60 R |
| 4,499,766 | 2/1985 | Fathauer et al. | 73/304 C |
| 4,558,274 | 12/1985 | Carusillo | 324/60 CD |
| 4,939,519 | 7/1990 | Elbert | 341/167 |
| 4,942,401 | 7/1990 | Gessaman et al. | 320/1 X |
| 4,968,946 | 11/1990 | Maier | 324/671 |
| 5,014,011 | 5/1991 | Colvin | 324/663 |
| 5,045,797 | 9/1991 | Kramer et al. | 324/667 |
| 5,278,513 | 1/1994 | Kramer et al. | 324/667 |
| 5,294,889 | 3/1994 | Heep et al. | 324/678 |
| 5,446,444 | 8/1995 | Lease | 340/514 |

Primary Examiner—Kenneth A. Wieder
Assistant Examiner—Glenn W. Brown
Attorney, Agent, or Firm—Jenner & Block

[57] ABSTRACT

A highly accurate system to measure the level of material in a vessel. A probe is provided in the vessel. The vessel and the probe are at different potentials so as to create a capacitance therebetween. The air and materials in the vessel act as dielectrics. As the material level varies, so does the capacitance. This capacitance is subjected to a charge-discharge-charge cycle yielding integrated net neutral charge. The duration of the cycle is compared to a reference time to determine capacitance, which is proportional to the level of material in the vessel.

17 Claims, 3 Drawing Sheets

APPARATUS AND METHOD FOR SENSING MATERIAL LEVEL BY CAPACITANCE MEASUREMENT

This application is a division of application Ser. No. 08/123,316, filed Sep. 17, 1993, now U.S. Pat. No. 5,461,321, issued Oct. 24, 1995.

FIELD OF THE INVENTION

This invention relates to capacitance measuring devices, generally, and in particular to devices for measuring the capacitance in a material-sensing probe.

BACKGROUND OF THE INVENTION

There are a variety of uses of capacitance measuring devices. One use in particular relates to detection of material levels (such as, for example, fluid in a tank). In these applications, a capacitance measuring probe is disposed in a material-containing vessel. The vessel and the probe are at different potentials so as to form a capacitor therebetween. The air and material contained in the vessel act as dielectrics. As the material level changes, so does the capacitance between the probe and the vessel.

Capacitance is normally measured using one of the following parameters: (a) differential impedance or admittance; (b) phase difference; or (c) frequency (or time), based on capacitive reactance.

The differential impedance technique is based on the generalized impedance formula:

$$Z = \sqrt{R^2 + (X_L - X_C)^2}$$

To use this technique, two parallel systems are established, each having identical drive frequency, drive amplitude, resistance and inductance. One system includes a reference capacitor of known value. The other system contains the capacitor which is to be measured. Thus, the only difference between the systems is capacitance. The output of the system with the known reference capacitor is compared to the output of the system with the unknown capacitance to determine a voltage or current differential. In accordance with Ohm's Law (v=iZ), the voltage (or current) differential is proportional to the values of capacitance.

One drawback to this system is that exact control and matching of inductances is difficult. Therefore, systems based on this principle, while very rugged, tend to have moderate overall accuracies (i.e., an error of approximately between one and three percent).

The phase difference technique is based on the capacitive reactance formula:

$$X_C = \frac{1}{-j\omega C}$$

To use this technique, two parallel systems are established, each with identical drive frequency and drive phase. One system includes a reference capacitor of known value. The other system contains the capacitor which is to be measured. Thus, the only difference between the systems is capacitance. The different capacitance causes the system's outputs to have different phase angles. The difference of phase angles is theoretically proportional to the values of capacitance. Unfortunately, a phase system with a linear relationship between capacitance and phase angle can be realized only with difficulty, and overall accuracy tends to be poor.

The frequency and time-based techniques are based on the generalized extension of Maxwell's electromagnetic theory:

$$v = \lambda f$$

Under this equation, frequency of repetitive waveforms is the inverse of wavelength (because velocity remains constant for a given set of propagation conditions). For a given time constant, $\tau = RC$ the voltage $V_C$ across a capacitor that is subjected to a charging voltage V is:

$$V_C = V[1 - \epsilon^{-\frac{t}{\tau}}];$$

and the voltage across a discharging capacitor that is initially at voltage V is:

$$V_C = V\epsilon^{-\frac{t}{\tau}}$$

Reversing the charge and discharge equations allows substitution of current for voltage. The curves generated by the above equations are of exponential form and extend to asymptotes, never fully converging.

By establishing an electronic oscillator or multi-vibrator which uses capacitive reactance as the variable frequency-determining element, a proportionality is established between the value of the capacitor and the resultant frequency or wavelength. Integrated circuit astable and monostable circuits (such as the 555 timer) often use this principle, and have been used to measure capacitance.

Typical gating for these forms of measurement is some form of comparator. Since waveforms are either exponential or transcendental (i.e., constantly varying slope), fixed comparator propagation delays contribute to errors. Frequency based systems also suffer from non-synchronous gating, resulting in a ±1 count errorband.

For use in (industrial) metrology systems, the symmetrical bipolar waveforms of sinusoidal oscillators are preferable. Typical pulse mode and astable type systems generate asymmetrically polarized waveforms which cause plating with certain chemical (i.e., ionic) dielectrics. Systems which AC couple (via a very large capacitor) to the sensed dielectric are also common. These charges are never totally in balance, resulting in plating.

Since frequency is directly proportional to capacitive reactance and inversely proportional to capacitance, a direct reading instrument based on frequency tends to be complex (usually requiring digital division). Time based systems are relatively simple due to direct scaling proportionality.

SUMMARY OF THE INVENTION

It is therefore an object of the invention to provide a highly accurate time-based system to measure the value of a capacitor. In accordance with the invention, the capacitor under test is subjected to a measurement cycle, the period of which defines a predetermined base reference time. During each measuring cycle, the capacitor is subjected to a charge-discharge-charge cycle yielding integrated net neutral charge. The duration of the charge-discharge-charge cycle is compared to the reference time to determine capacitance. At the conclusion of the charge-discharge-charge cycle,, the capacitor is shunted or "clamped" to a reference ground for the remaining duration of the measurement cycle. This shunt or "dwell" time provides a delay for discharging dielectric absorption during each measurement cycle.

The charging of the capacitor is linear with respect to time.

To create a linear charging (discharging) slope with a capacitor $$C \frac{\Delta v}{\Delta t} = \frac{\Delta Q}{\Delta t}$$

is used by maintaining $\Delta Q/\Delta t = k$ (k depends on range of capacitance to be measured) for any state of capacitor charge. Constant charge accumulation yields constant capacitor voltage amplitude change, therefore a linear slope. Practical realization is a positive and a negative constant current source that can be switched to the capacitor at appropriate charge level intervals. To minimize dielectric absorption effects a shunt is applied to the capacitor as a portion of each measurement cycle, this negates the requirement for an auto-zero type circuit also guarantees the integrated net charging of the capacitor to be zero.

In one embodiment, a capacitance measuring device generates an output signal having a time duration that is a linear function of the capacitance being measured. The device includes two constant current sources of opposite polarity. The current sources provide linear charging of the capacitor at identical rates. The capacitor being measured has one electrode coupled to a reference ground, and the other coupled to a sensing lead. A plurality of comparators (or other suitable voltage sensors) are coupled to the sensing lead and a resistor network to detect the voltage level across the tested capacitor.

A control subsystem is responsive to the voltage sensors. The control subsystem initially couples the sensing lead to the first current source to charge the capacitor to a first predetermined voltage. When the capacitor has reached the first predetermined voltage, the control subsystem couples the sensing lead to the second current source to charge the capacitor to a second predetermined voltage. The second predetermined voltage is opposite in polarity to the first predetermined voltage, but is preferably equal in magnitude. Thus, the ground reference voltage is intermediate the first and second predetermined voltages.

When the capacitor attains the second predetermined voltage, the control subsystem couples the sensing lead back to the first current source to charge the capacitor to the ground reference voltage. When the capacitor reaches the ground reference voltage, the charge-discharge-charge cycle is complete. The control subsystem couples the sensing line to the reference ground to clamp the capacitor to ground for the duration of the dwell time. The time to complete the charge-discharge-charge cycle as a percentage of the reference time is proportional to the capacitance.

The control subsystem can be constructed in a variety of ways. The preferred technique is based on a counter, a resistor network defining positive, negative and ground reference voltages, and a plurality of comparators for comparing the sensing line voltage to the reference voltages. Other control techniques can be used.

DESCRIPTION OF THE PREFERRED EMBODIMENT

Figure 1:
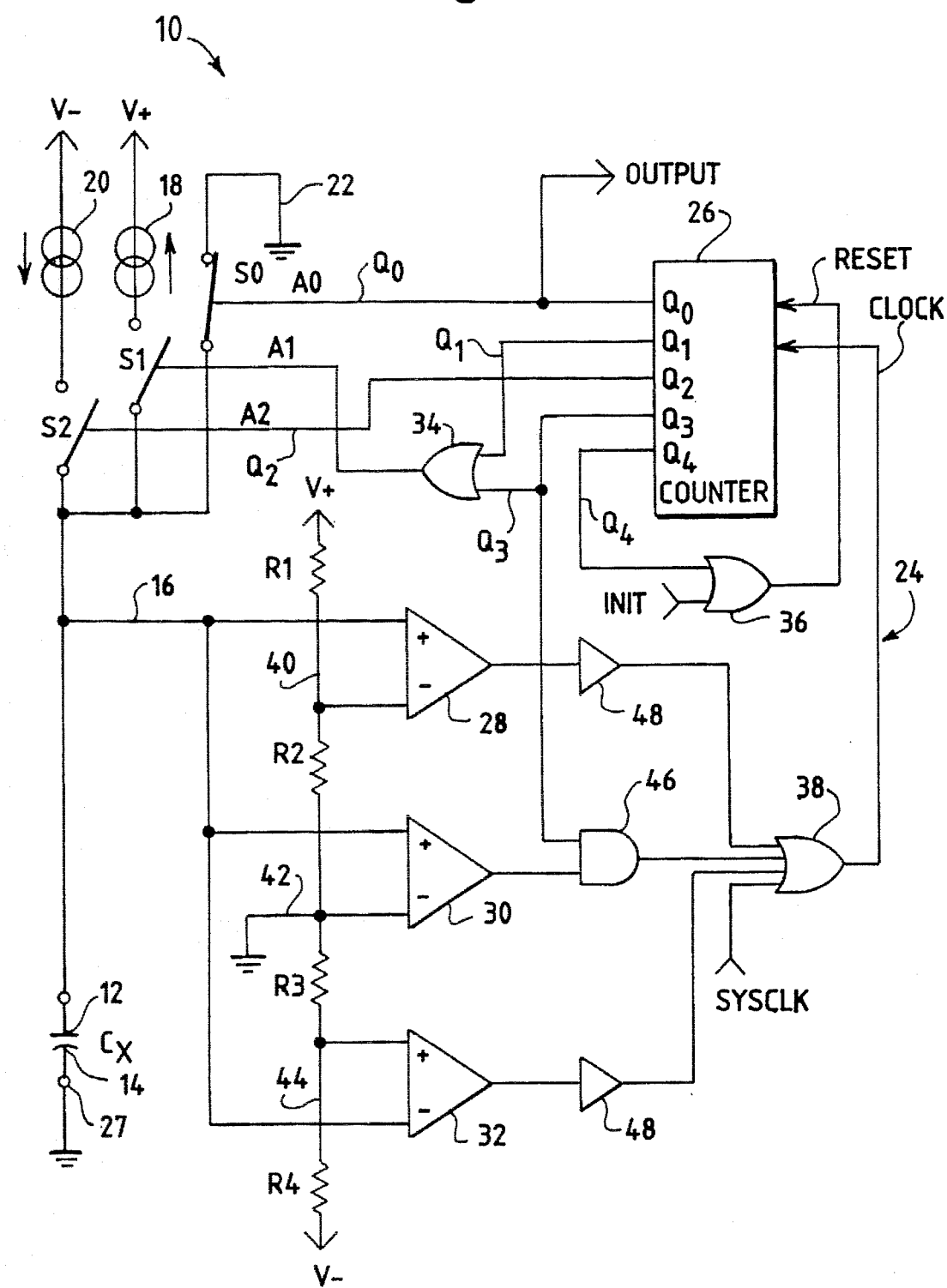
FIG. 1 is a block diagram of a capacitance measuring device in accordance with the invention.

FIG. 1 illustrates a device 10 for measuring the capacitance of a capacitor $C_x$ having plates 12 and 14. Capacitance measuring device 10 includes a sensor line 16 which is coupled to probe plates 12 of measured capacitor $C_x$, a positive current source 18, a negative current source 20, and a reference ground 22. Current sources 18 and 20 are mirror sources of opposite polarity and equal amperage. Sensor line 16 is selectively coupled to ground 22, current source 18, and current source 20 by switches S0, S1 and S2, respectively. As explained below, switches S0–S2 are actuated via control lines $A_0$–$A_2$ respectively by a control subsystem 24. Each switch S0–S2 remains open until its respective control line is asserted. Plate 14 of capacitor $C_x$ is connected to a ground 27, which is at the same potential as reference ground 22.

Measuring device 10 calculates the capacitance of capacitor $C_x$ during a reference time (or "measurement cycle") that is determined by the period of an external master clock signal SYSCLK, discussed below. During the measurement cycle, device 10 subjects the measured capacitor to a linear charge-discharge-charge cycle which includes three discrete stages, discussed below in greater detail. The time to complete the charge-discharge-charge cycle is compared to the reference time to determine the capacitance of capacitor $C_x$. The process is repeated for continuous monitoring of capacitance.

In charging measured capacitance $C_x$, one complete linear triangle wave is used. The desired characteristics of the waveform are described using the general slope equation $y = mx + b$. Offset [b] must be equal to 0 (i.e. reference ground 22) to ensure symmetrical polarities yielding net integration of zero charge to prevent polarization and potential plating. The slope [m] must be linear at all points to negate the variability of propagation delays. Its absolute abscissa referenced value in all quadrants must be inversely proportional to the measured capacitor (directly proportional to capacitive reactance). During the detection cycle, the capacitor $C_x$ is initially discharged by closing, switch S0 to couple sensor line 16 to reference ground 22. Then, capacitor $C_x$ is charged to a predetermined positive voltage level (such as +5V) by closing switch S1 to couple sensor line 16 to positive current source 18. When capacitor $C_x$ reaches this positive voltage, capacitor $C_x$ is discharged to a predetermined negative voltage (such as –5V) by closing switch S2 to couple sensor line 16 to negative current source 20. When capacitor $C_x$ reaches this negative voltage, capacitor $C_x$ is charged to the reference ground 22 by closing switch S1 to couple sensor line 16 to positive current source 18. When capacitor $C_x$ reaches the reference ground, it is clamped to ground by closing switch S0. Capacitor $C_x$ remains clamped to ground until the beginning of the next measured cycle (i.e., the next pulse of master clock signal SYSCLK).

The desired opening and closing of switches S0–S2 is achieved by means of control subsystem 24. Control subsystem 24 features a system counter 26 and three voltage sensing comparators 28, 30 and 32. System counter 26 has five outputs $Q_0$ through $Q_4$, along with RESET and CLOCK inputs. System counter 26 operates like a ring counter in that only one output may be high at any given time. When the RESET input goes high, system counter 26 sets output $Q_0$ to high, and outputs $Q_1$–$Q_4$ to low. System counter 26 then sequentially sets one (and only one) of the outputs $Q_1$ through $Q_4$ high each time the CLOCK input is strobed.

Output $Q_0$ is coupled to an external signal OUTPUT and switch control line $A_0$. The OUTPUT signal is discussed below in connection with the dynamic operation of device 10. Switch control line $A_0$ closes switch $S_O$ during the time the clock output $Q_0$ is asserted. Clock output $Q_1$ is coupled via an OR gate 34 to line $A_1$ so that switch S1 is closed when output $Q_1$ is asserted. Output $Q_2$ is coupled to line $A_2$ so that switch $S2$ is closed when output $Q_2$ is asserted. Output $Q_3$ is coupled to OR gate 34. As explained above in connection with output $Q_1$, the output of OR gate 34 is coupled to line $A_1$ to close switch S1 when either output $Q_3$ or $Q_1$ is high. Output $Q_4$ is coupled via an OR gate 36 to the RESET input. Thus, when output $Q_4$ is high, system counter 26 is reset.

An externally generated master reset signal INIT is connected to the RESET input of counter 26 through OR gate 36. OR gate 36 allows both master reset signal INIT and output $Q_4$ of system counter 26 to control the return to the initial state. Master reset signal INIT is generated when the system is being prepared for operation, such as, for example, at initial power up. Otherwise, the process automatically resets at the conclusion of each charge-discharge-charge cycle when output $O_4$ is asserted as explained above.

The period of the external master clock signal SYSCLK defines the time reference. Master clock signal SYSCLK is gated through an OR gate 38 to the CLOCK input of system counter 26, so that each pulse of master clock SYSCLK increments system counter 26.

A resistive divider network composed of R1, R2, R3 and R4 establishes a positive reference voltage 40, a ground reference 42, and a negative reference voltage 44, as illustrated in FIG. 1. (Ground references 22, 27 and 42 are isopotential). Reference voltages 40 and 44 should be equal in magnitude (5V) and opposite in polarity.

The output of first comparator 28 is high when sensor line 16 is more positive than positive reference voltage 40. The output of third comparator is high when sensor line 16 is more negative than the negative reference voltage 44. The output of second comparator 30 is high when sensor line 16 crosses ground reference 42. The output of second comparator 30 is enabled or disabled by output $Q_3$ of the system counter 26 through an AND gate 46.

All three comparators 28, 30 and 32 are connected without any hysteresis feedback for optimizing switching points and times. This is possible since at first switching the effectiveness of each is negated as charging direction is changed at that point in time. For propagation delay equalization, two buffers are added to the outputs of comparators 28 and 32, respectively, effectively equalizing the delay through AND gate 46.

Suitable components for constructing the foregoing device 10 are set forth below. The preferred current sources 18 and 20 are disclosed in U.S. Pat. Appln. Ser. No. 08/122,212 entitled "Bipolar Tracking Current Source/Sink With Ground Clamp" (the disclosure of which is hereby incorporated by reference in its entirety).

| | |
|---|---|
| Supply voltages | ±7 Vdc |
| System counter (26) | CD4017BC |
| 2 input OR gate (34) | CD4071BC |
| 2 input AND gate (46) | CD4081BC |
| 4 input OR gate (38) | CD4072BC |
| Analog switches (S0–S2) | CD4066BC |
| Operational amplifier (28, 30, 32) | LM308 |
| Base reference time | 1 mS |
| Master clock signal | CD4528BC |
| Resistors R1, R4 | 2KΩ |
| Resistors R2, R3 | 5KΩ |

Figure 2:
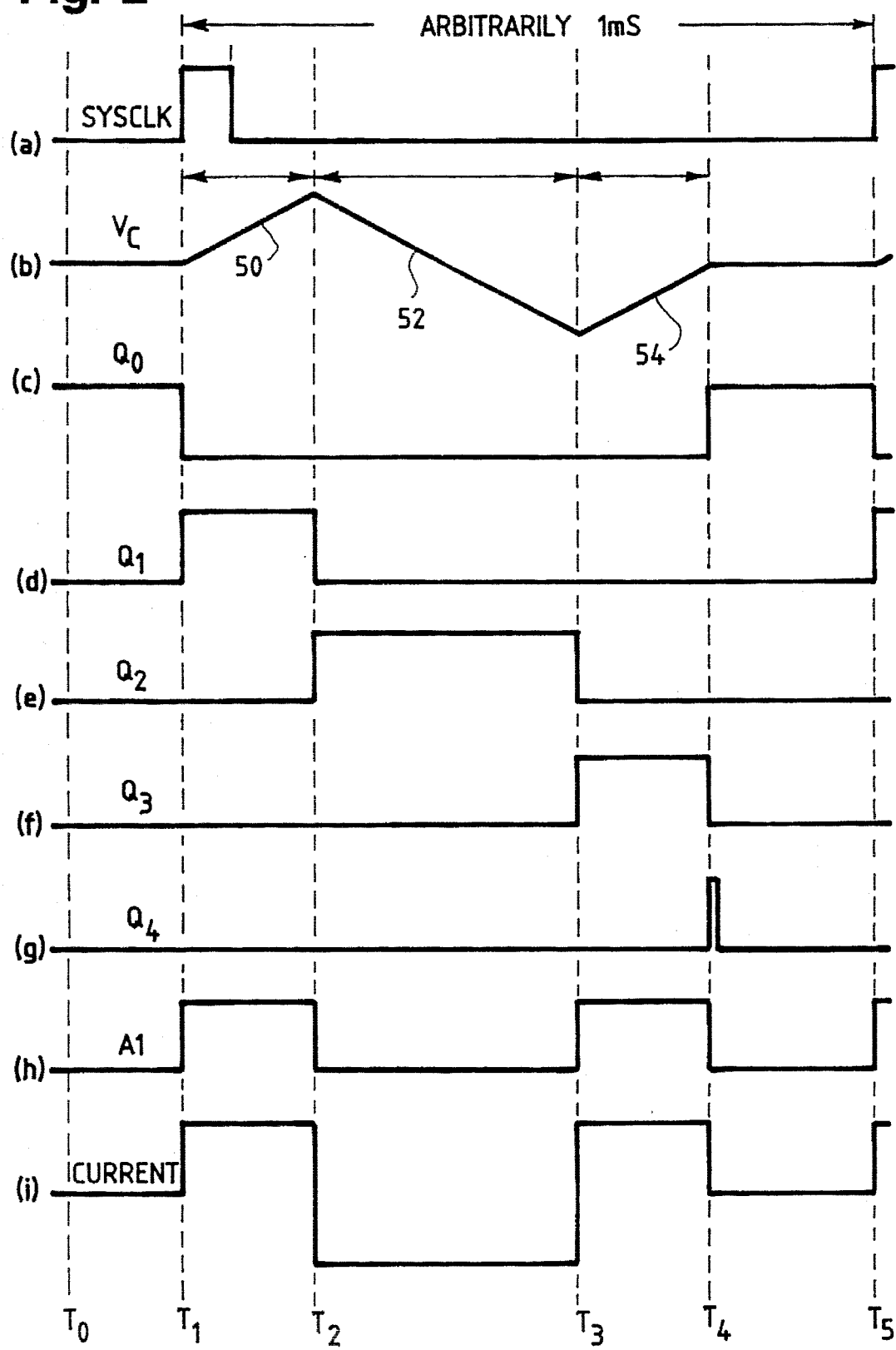
FIG. 2 is a timing diagram illustrating the operation of the device shown in FIG. 1.

The dynamic operation of capacitance measuring device 10 is illustrated in the timing diagram of FIG. 2. For clarity, lines (a) through (i) of FIG. 2 illustrate the following signals:

(a) Master clock 50
(b) Voltage waveform of capacitor $C_x$
(c) $Q_0$ of system counter 26
(d) $Q_1$ of system counter 26
(e) $Q_2$ of system counter 26
(f) $Q_3$ of system counter 26
(g) $Q_4$ of system counter 26
(h) $A_1$ switch control line
(i) Charging current waveform of sensor line 16

The outputs of comparators 28, 30, 32 are connected via OR gate 38 to the CLOCK input of system counter 26. As explained above, counter 26 increments each time the CLOCK input is strobed. Thus, system counter 26 increments whenever an output from one of the three level sensing comparators 28, 30 and 32 goes high. As explained above, master clock signal SYSCLK is also gated through the OR gate 38 to the CLOCK input of system counter 26. Master clock signal SYSCLK establishes the base reference time for the entire measuring cycle, and provides an initial clock pulse to start the operation.

As best seen in lines (a) and (b) of FIG. 2, the entire charge-discharge-charge cycle occurs during the measuring cycle (i.e., during interval between pulses of master clock signal SYSCLK). This interval is set to 1 mS (for example) to ensure that it is longer than the expected duration of the charge-discharge-charge cycle. This provides a dwell line during each measurement cycle where the sensor line 16 is shunted (or "clamped") to reference ground 22.

The temporal duration of the charge-discharge-charge cycle is determined with reference to output $Q_0$ of the system counter (available externally as the OUTPUT signal). Output $Q_0$ is illustrated in line (c) of FIG. 2. The duration of the charge-discharge-charge cycle is compared to the time reference (i.e., the period between clock pulses from the master clock signal SYSCLK) to establish the proportionality for determining the value of the measured capacitor $C_x$. For example, if the base reference time of 1 mS corresponds to a capacitance value of 100 pF, then a charge-discharge-charge cycle that lasts is 0.75 mS indicates a capacitance value of 75 pF.

Referring to FIG. 2, at time $T_O$ (before a measurement cycle begins) sensor line 16 is clamped to the reference ground 22 to minimize the dielectric absorption error and standardize the starting condition. Since sensor line 16 is clamped to reference ground 22, the outputs of comparators 28 and 32 are low. The zero crossing detector comparator 30 is also low because its output is disabled by AND gate 46 ($Q_4$ of system counter 26 is low). Clamping is achieved by closing analog switch S0 by output $Q_0$ of system counter 26. System counter 6 can have one, and only one, output high at any point in time. Therefore, current sources 18 and 20 are not connected to the sense line 16 by the analog switches S1 and S2 at time $T_0$.

At time $T_1$, counter 26 receives a pulse from master clock signal SYSCLK. System counter output $Q_0$ goes low, opening switch S0. Simultaneously, output $Q_1$ goes high and (via OR gate 34) causes switch S1 to close. Lines (c) and (d) of FIG. 2 illustrate the outputs $Q_0$ and $Q_1$ of the system counter 26. The closing of switch S1 connects positive current source 18 with measured capacitor $C_x$ (via sensor line 16), allowing the positive current source 18 to charge the measured capacitor $C_x$ towards predetermined positive reference voltage 40 (established by resistors $R_1$ and $R_2$ as illustrated in line (b) of FIG. 2. At time $T_2$ (shown in FIG. 2), measured capacitor $C_x$ (and sensor line 16) is charged to positive reference voltage 40. The output of first comparator 28 goes high, pulsing the CLOCK input of system counter 26 (via OR gate 38). As explained above, this causes counter 26 to increment.

When system counter 26 increments at time $T_2$, outputs $Q_1$ and $Q_2$ simultaneously reverse states, opening switch S1 and closing switch S2. (Line (e) of FIG. 2 displays output $Q_2$ of system counter 26.) When switch S2 is closed, negative current source 20 provides charging current to measured capacitor $C_x$ and the sense line 16. Measured capacitor $C_x$ begins to discharge toward negative reference voltage 44 established by resistive divider network R3 and R4. The (dis)charging continues in a linear fashion until measured capacitor $C_x$ reaches negative reference voltage 44 at time $T_3$ (shown in FIG. 2). The output of third comparator 32 goes high, pulsing the clock input of system counter 26 through OR gate 38. As explained above, this causes counter 26 to increment.

When system counter 26 increments at time $T_3$, outputs Q2 and Q3 reverse states. Output $Q_2$ goes low, opening switch S2, thereby disabling negative current source 20. Simultaneously, output $Q_3$ goes high, closing switch S1 (via OR gate 34), and enabling second comparator 30 (via AND gate 46). The closing of switch S1 enables positive current source 18. The polarity reverses and the measured capacitor $C_x$, begins to (dis)charge towards ground reference 22. As illustrated at line (b) of FIG. 2, at time $T_4$, the voltage of sensor line 16 crosses the ground reference level 42. The output of second comparator 30 goes high, pulsing the CLOCK input to increment and system counter 26.

When system counter 26 increments at time $T_4$, output $Q_3$ goes low and output $Q_4$ goes high. Output $Q_4$ resets the system counter 26 (via OR gate 36 and the RESET input). Output $Q_0$ returns to high (as seen in line (c) of FIG. 2), thereby closing switch S0 to clamp measured capacitor $C_x$ to reference ground 22. This completes one bipolar charge-discharge-charge cycle of the measured capacitor $C_x$, and maintains the isopotential clamp.

Another charging sequence will begin at time $T_5$, when the next master clock pulse SYSCLK is received by the system counter 26. The duration of the charge-discharge-charge cycle is represented by the period between times $T_1$ and $T_4$, during which output $Q_0$ is low (as shown in line (c) of FIG. 2). This period is the sum of the durations of three discrete charge events that occur during the charge-discharge-charge cycle, illustrated respectively by reference numerals 50, 52 and 54 in FIG. 2. The entire charge-discharge-charge cycle must occur between two sequential clock pulses of master clock signal SYSCLK, which defines the base time reference (i.e., between times $T_1$ and $T_5$ of FIG. 2). As part of the design, current amplitude supplied by the current sources 18 and 20 (as well as the frequency master clock signal SYSCLK) must be balanced against the expected range of capacitance values to be measured so that the charge-discharge-charge cycle is completed within the base time reference.

The charge-discharge-charge cycle should complete early enough to provide a dwell time wherein the measured capacitor $C_x$ remains charged to reference ground 22 until the next pulse of master clock signal SYSCLK. Dwell time (as illustrated in FIG. 2) occurs between times $T_4$ and $T_5$. Dwell time should be at least approximately nine percent by the base reference time. An adequate dwell time allows device 10 to measure a range of capacitances. The range can be adjusted by changing the rate of the constant current sources 18 and 20.

It is important that the integrated net charge imposed on the measured capacitor be neutral. Accordingly, the current sources should be of equal current amplitude. Also, the positive and negative voltage references should be of equal magnitude (albeit opposite polarity). Finally, the charging of the capacitor must be linear with respect to time. Linear charging allows the positive and negative portions of the capacitor's voltage waveform to sum to a net neutral charge.

The ratio of the duration of output $Q_0$ (available externally as the OUTPUT signal) to the base reference time is proportional to the measured capacitance. Thus, if the base reference time is preserved, the OUTPUT signal is capable of being interfaced to analog circuitry, time base referencing, digital computational or other final readout circuitry.

Figure 3:
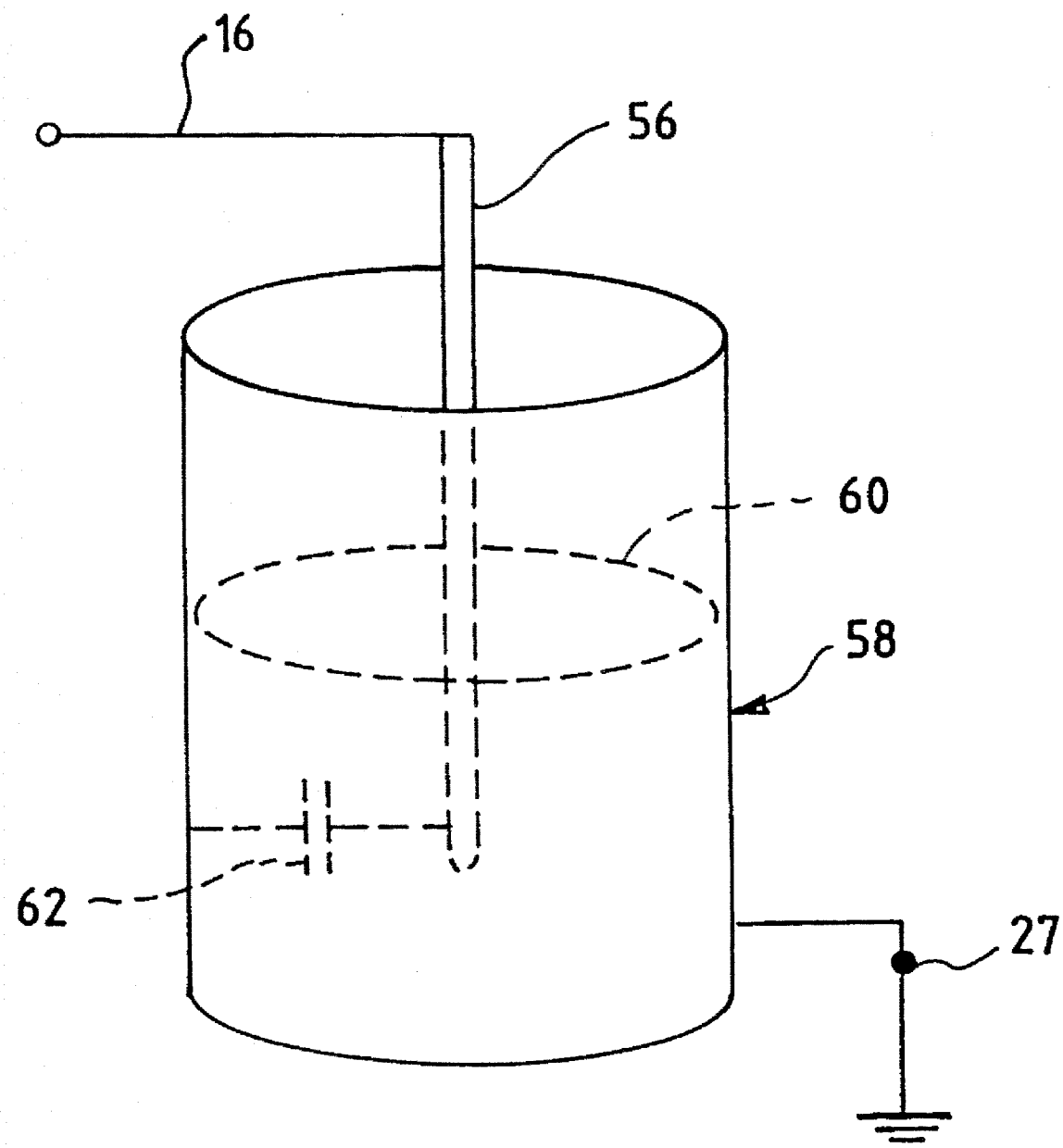
FIG. 3 is a fluid measuring system which employs the capacitance measuring device shown in FIG. 1.

There are a variety of uses of capacitance device 10. One particularly useful application relates to detection of material levels (such as, for example, fluid in a tank). Referring to FIG. 3, a capacitance measuring probe 56 is disposed in a vessel 58 containing a material 60. The vessel and the probe are at different potentials so as to create a capacitance therebetween. This capacitance is represented by the capacitor symbol 62 of FIG. 3. The air and materials contained in the vessel act as dielectrics. As the material level changes, so does the capacitance between the probe and the vessel. In accordance with the invention, probe 56 is coupled to sensor line 16, and the vessel to reference ground 27. The capacitance between probe 56 and vessel 58 is then measured as explained above to determine the level of material in the vessel. A suitable probe is disclosed in U.S. patent application Ser. No. 08/122,849 entitled "High Pressure, Leak Resistant, Explosionproof Capacitance Probe" (the disclosure of which is hereby incorporated by reference in its entirety).

We claim:

1. A device for monitoring the level of a material in a container, comprising:

probe means for developing a capacitance that varies with the level of material in the container;

charging means for subjecting the capacitance to a charge-discharge-charge cycle, wherein the capacitance is linearly charged to a first predetermined voltage, then linearly charged to a second predetermined voltage that is opposite in polarity from the first predetermined voltage, and then linearly charged to a reference voltage that is intermediate the first and second predetermined voltages; and output means for generating an output signal that varies in accordance with the duration of the charge-discharge-charge cycle, said duration being directly proportional to said capacitance.

2. The device of claim 1 further comprising means for generating a clock signal having a period that defines a reference time, wherein the charge-discharge-charge cycle is initiated at the beginning of the reference time, and wherein the output signal varies in accordance with the duration of the charge-discharge-charge cycle relative to the reference time.

3. The device of claim 2 wherein, after the charge-discharge-charge cycle is complete, the charging means maintains the capacitance at the reference voltage until the reference time has elapsed.

4. The device of claim 1 wherein the integrated net charge of the charge-discharge-charge cycle is equal to zero.

5. The device of claim 4 wherein the first and second predetermined voltages are equal in magnitude and opposite in polarity.

6. The device of claim 1 wherein the charging means includes a first and second constant current sources having opposite polarities, wherein the changing means initially couples the capacitance to the first current source to linearly charge the capacitance to the first predetermined voltage, and then couples the capacitance to the second current source to linearly charge the capacitance to the second predetermined voltage.

7. The device of claim 1 wherein at the completion of the charge-discharge-charge cycle, the charging means holds the capacitance at the reference voltage for an amount of time sufficient to substantially reduce the effects of dielectric absorption.

8. The device of claim 1 wherein the charging means periodically repeats the charge-discharge-charge cycle, and, at the end of each charge-discharge-charge cycle, maintains the capacitance at the reference voltage until the beginning of the next charge-discharge-charge cycle.

9. A method for measuring the level of a material in a vessel, comprising the steps of:

developing a capacitance between a probe and the vessel, said capacitance varying with the level of the material in the container;

subjecting the capacitance to a charge-discharge-charge cycle, wherein the capacitance is linearly charged to a first predetermined voltage, then linearly charged to a second predetermined voltage that is opposite in polarity from the first predetermined voltage, and then linearly charged to a reference voltage that is intermediate the first and second predetermined voltages; and generating an output signal that varies in accordance with the duration of the charge-discharge-charge cycle, said duration being directly proportional to said capacitance.

10. The method of claim 9 further comprising the step of generating a clock signal having a period that defines a reference time, wherein the charge-discharge-charge cycle is initiated at the beginning of the reference time, and wherein the output signal varies in accordance with the duration of the charge-discharge-charge cycle relative to the reference time.

11. The method of claim 9 further comprising the step of after the charge-discharge-charge cycle is complete, maintaining the capacitance at the reference voltage until the reference time has elapsed.

12. The method of claim 9 wherein the integrated net charge of the charge-discharge-charge cycle is equal to zero.

13. The method of claim 12 wherein the first and second predetermined voltages are equal in magnitude and opposite in polarity.

14. The method of claim 9 wherein the step of charging the capacitance to the first predetermined voltage is accomplished by coupling the capacitance to a first constant current source, and the step of linearly charging the capacitance to the second predetermined voltage is accomplished by coupling the capacitance to a second constant current source, wherein said first and second constant current sources have opposite polarity.

15. The method of claim 9 further comprising the step of, at the completion of the charge-discharge-charge cycle, holding the capacitance at the reference voltage for an amount of time sufficient to substantially reduce the effects of dielectric absorption.

16. The method of claim 9 further comprising the step of periodically repeating the charge-discharge-charge cycle, and, at the end of each charge-discharge-charge cycle, maintaining the capacitance at the reference voltage until the beginning of the next charge-discharge-charge cycle.

17. The method of claim 9 further comprising the step of using the output signal to drive a display indicating the level of material in the vessel.

* * * * *

UNITED STATES PATENT AND TRADEMARK OFFICE
CERTIFICATE OF CORRECTION

PATENT NO. : 5,554,937
DATED : Sept. 10, 1996
INVENTOR(S) : Gary G. Sanders and Brian J. Goodwin It is certified that error appears in the above-identified patent and that said Letters Patent is hereby corrected as shown below:

Column 2, line 61, after "cycle" delete the second comma (,)

Column 4, line 36, after "closing" delete the comma (,)

Column 4, line 65, delete "$S_o$" and insert -- $S_0$ --

Column 5, line 3, delete "explai,;d" and insert -- explained --

Column 5, line 30, after "comparator" insert -- 32 --
Column 5, line 41, after "buffers" insert -- 48 --

Column 6, line 39, delete "$T_o$" and insert -- $T_0$ --

Column 6, line 48, delete "6" and insert -- 26 --

Signed and Sealed this

Seventh Day of January, 1997

Attest:

BRUCE LEHMAN

Attesting Officer        Commissioner of Patents and Trademarks